US006754405B2

(12) United States Patent
Vendier et al.

(10) Patent No.: US 6,754,405 B2
(45) Date of Patent: Jun. 22, 2004

(54) ELECTRONIC ASSEMBLY HAVING HIGH INTERCONNECTION DENSITY

(75) Inventors: Olivier Vendier, Balma (FR); Marc Huan, Cox (FR); Sylvain Paineau, Clamart (FR)

(73) Assignee: Alcatel, Paris (FR)

( * ) Notice: Subject to any disclaimer, the term of this patent is extended or adjusted under 35 U.S.C. 154(b) by 123 days.

(21) Appl. No.: 09/865,720

(22) Filed: May 29, 2001

(65) Prior Publication Data

US 2001/0050430 A1 Dec. 13, 2001

(30) Foreign Application Priority Data

Jun. 8, 2000 (FR) ............................................ 00 07 352

(51) Int. Cl.[7] ................................................ G02B 6/12
(52) U.S. Cl. ................................ 385/14; 385/2; 385/15
(58) Field of Search ................................. 385/14, 15, 2, 385/8, 12, 39

(56) References Cited

U.S. PATENT DOCUMENTS

| | | | | |
|---|---|---|---|---|
| 4,729,296 A | * | 3/1988 | Sabin ........................... | 99/349 |
| 4,836,637 A | * | 6/1989 | Poorman et al. ............... | 385/60 |
| 5,276,455 A | * | 1/1994 | Fitzsimmons et al. ......... | 343/777 |
| 5,300,810 A | * | 4/1994 | Eden ............................ | 257/686 |
| 5,333,225 A | * | 7/1994 | Jacobowitz et al. ........... | 385/93 |
| 5,428,190 A | * | 6/1995 | Stopperan .................... | 174/261 |
| 5,510,958 A | | 4/1996 | Shimabara et al. | |
| 5,734,553 A | | 3/1998 | Hong | |
| 6,014,313 A | * | 1/2000 | Hesselbom ................... | 361/704 |
| 6,320,257 B1 | * | 11/2001 | Jayaraj et al. ............... | 257/723 |
| 6,349,553 B1 | * | 2/2002 | Pfister et al. ............... | 62/259.2 |
| 6,430,052 B1 | * | 8/2002 | Kordes et al. ............... | 361/719 |

FOREIGN PATENT DOCUMENTS

| | | |
|---|---|---|
| DE | 199 00 534 A1 | 2/2000 |
| GB | 2 322 203 A | 8/1998 |

OTHER PUBLICATIONS

Patent Abstracts of Japan, vol. 1999, No. 14, Dec. 22, 1999 corresponding to Japanese Patent No. 11 249215 A dated Sep. 17, 1999.

* cited by examiner

*Primary Examiner*—Frank G. Font
*Assistant Examiner*—Kevin C Kianni
(74) *Attorney, Agent, or Firm*—Sughrue Mion, PLLC

(57) ABSTRACT

An electronic assembly comprising an electronic module provided with optical interconnection and heat removal means, the heat removal means comprising a soleplate dedicated to removing heat on which the module is mounted. The interconnection means is independent of the soleplate and preferably comprises a printed circuit and an optical fiber included in the printed circuit. The optical fiber has an end put accurately in register with an optical contact of the module by a BGA type mounting of the printed circuit on the module. A BGA type mounting consists in placing with precision firstly balls on the module and secondly areas on the circuit, and then in bringing the balls and areas face to face so that the balls center themselves automatically with the areas by capillarity.

22 Claims, 2 Drawing Sheets

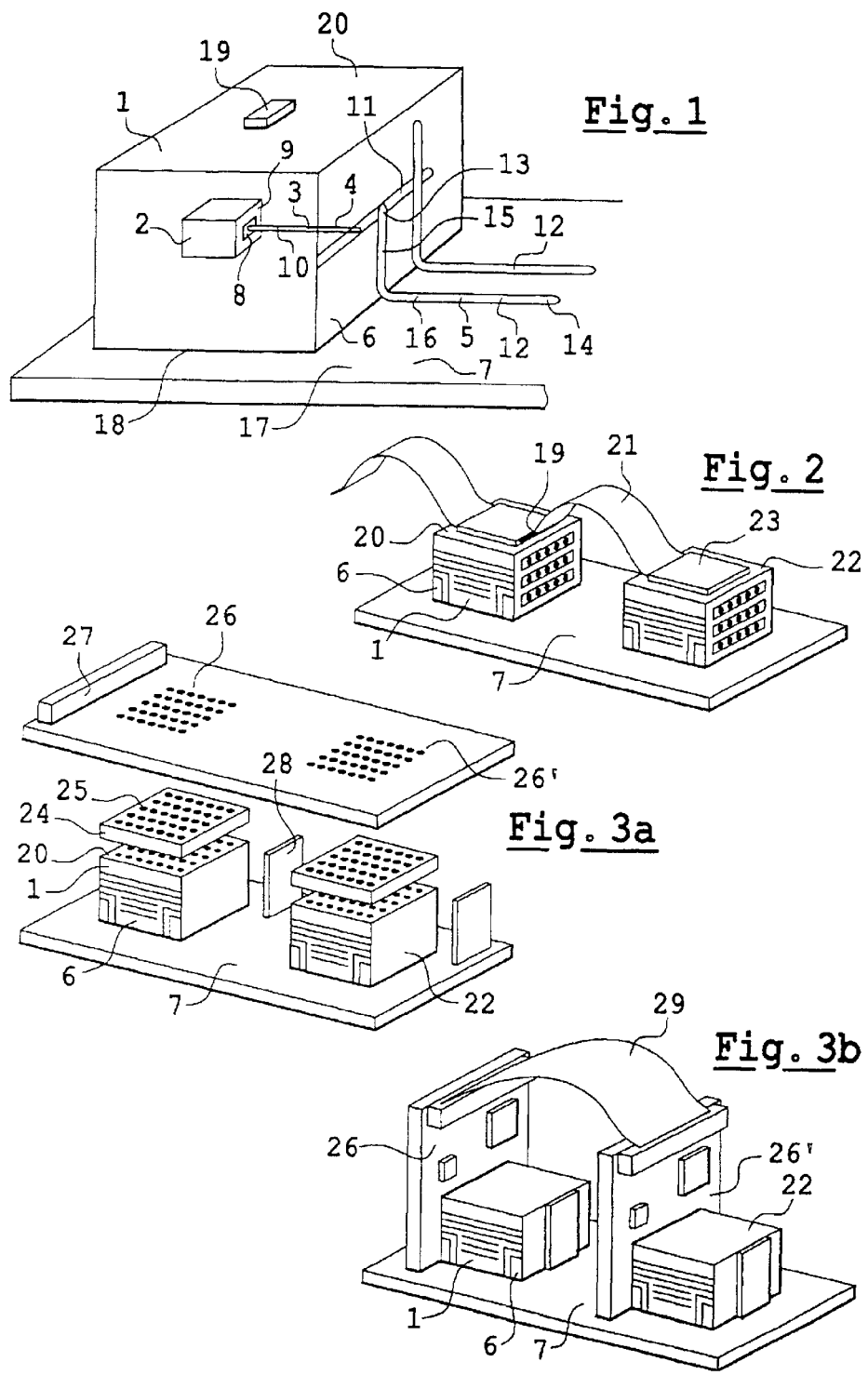

ELECTRONIC ASSEMBLY HAVING HIGH INTERCONNECTION DENSITY

The present invention relates to an electronic assembly having high-density interconnections. A particular application of the invention lies in the field of integrated electronic modules, i.e. modules comprising a plurality of specialized integrated circuits known as application specific integrated circuits (ASICs). These ASICs perform numerous complex functions, and for them to operate it is necessary for a large number of inlet and outlet ports on the module to be served. The field of the invention is particularly that of integrated modules of three-dimensional structure, and in a preferred example, in the form of a cube.

BACKGROUND OF THE INVENTION

In the state of the art, cube-shaped integrated electronic modules are known that are connected via one of their faces to a printed circuit card. The electronic module is mounted by soldering tabs on the module to transfer contacts on the card. In order to dissipate the heat given off by such a module in operation, a heat removal system is known including a heat drain, which heat drain is embedded in the card. The module has a face that is placed on or in register with a zone of the printed circuit card. This face is the only interface between the module and the card. Thus, the functions of interconnection and of removing heat are both performed via said interface.

The state of the art assembly raises a problem since it firstly prevents the module from providing interconnections at high density. Secondly, the heat removal system that is provided is not sufficient since it is made in the printed circuit card, even through firstly the amount of heat to be removed is large and secondly the removal system cannot be too large in size given the miniaturization conditions imposed on such integrated modules and printed circuit cards. Furthermore, the card cannot receive a miniature heat removal system of higher performance since it is constituted by a substrate made of a material that has poor heat conduction characteristics.

OBJECTS AND SUMMARY OF THE INVENTION

An object of the invention is to remedy the above-mentioned problem by proposing an electronic assembly provided with a cooling device and also proposing interconnection means for the electronic module, the interconnection means being distinct from the cooling device. The advantage of the invention is to make use of the three-dimensional structure of the electronic module to separate the interconnection function and the heat removal function, thereby enabling each of these functions to be optimized independently of the other.

The cooling device of the invention consists in an insulating soleplate connected to one of the faces of the integrated module, said face being distinct from a second face of said module, the second face being presented in such a manner as to be suitable for connection with a printed circuit card. The soleplate is selected to have good heat exchange capacity. Since it presents no interconnection function for the module, it can act without interference to remove the large quantity of heat emitted by the module.

In addition, the entire second face of the module can be used for providing interconnection functions, and none of its area needs to be set aside for removing heat. Consequently, the invention makes it possible to propose a module that offers a greater density of interconnections.

The invention provides an electronic assembly comprising at least a first integrated electronic module, the first module including at least one interconnection means for optical connection to a printed circuit card or to a second electronic module, the assembly including a soleplate and heat removal means for removing heat from said module to the soleplate, and wherein the soleplate is independent of the interconnection means of the first module.

In the state of the art, modules are known that are provided with optical interconnection means. Optical interconnection means present the advantage of being insensitive to the electromagnetic fields created in environments of the kind that surround modules of the invention. In addition, optical interconnections present the advantage of making it possible to achieve a greater density of interconnections than when using electronic interconnections.

In the state of the art, optical interconnection means comprise an optical fiber and an optical connector unit. The connector unit has a first optical connector mounted on the module, for example, and a second optical connector mounted on one end of the optical fiber for connecting the optical fiber to the module. The first and second connectors need to be assembled together with very great precision. The end of the optical fiber must be put into register with the first optical connector very precisely in order to guarantee good transmission of the optical signal through the connector unit. For this purpose, the connector unit has at least one means for aligning the fiber with the first optical connector.

In general, the alignment means comprise specific transfer means. In general, the alignment means further comprise converging lenses to focus a light beam conveyed by means of such a fiber.

These optical interconnections and contacts present a major drawback. They are complex and bulky, and they are not suitable for designing modules having a high density of connections operating at high data rates. The first specific transfer means are bulky and prevent optical interconnections achieving high density on such miniature modules. Furthermore, proper positioning of the converging lenses is difficult to achieve. Finally, these extremely accurate alignment means are expensive, making the use of optical interconnections on integrated electronic modules expensive.

Another object of the invention is to remedy the problems mentioned by proposing a module having optical interconnection means that make it possible to avoid the presence of specific transfer means to guarantee the alignment accuracy that is required for such optical interconnections. The optical interconnection means of the invention no longer require the presence of a connector unit. The invention provides for an optical fiber, e.g. included in a printed circuit, to be put into register with an optical contact of the module merely by mounting the printed circuit with precision on a face of the module that has the optical contact. The precision mounting implemented is compact since the contact points between the printed circuit and the face are limited to micropoints that are disposed very accurately respectively on the face of the module and on the printed circuit. Thereafter, these micropoints are interconnected by capillarity during a step of melting the micropoints when they are at a very small distance apart from one another.

This method of bringing points into register thus enable the density of the optical connectors presented by such an electronic module to be increased because the space required for the specific transfer means of the optical connectors is now available to present additional optical contacts.

In a preferred example, the invention provides an electronic assembly comprising at least a first integrated electronic module, a printed circuit card, and optical interconnection means for connecting the integrated electronic modules to the printed circuit card, wherein the optical interconnection means comprise a first optical contact of the first integrated electronic module, and a second optical contact on the printed circuit card, and wherein the first optical contact is mounted precisely in register with the second optical contact by means of beads bonded to the module, the beads being self-centering with metal areas of the printed circuit card during assembly.

BRIEF DESCRIPTION OF THE DRAWINGS

The invention will be better understood on reading the following description and on examining the accompanying figures which are not to scale. The figures are given purely by way of non-limiting indication of the invention. In the Figures:

FIG. 1 is a diagrammatic view of an electronic assembly provided with heat removal means of the invention;

FIG. 2 is a view of an electronic assembly having two electronic modules provided with heat removal means of the invention and interconnected in a first manner;

FIG. 3a is a view of two electronic modules provided with heat removal means of the invention and interconnected in a second manner;

FIG. 3b is a view of two electronic modules provided with heat removal means of the invention and interconnected in a third manner;

MORE DETAILED DESCRIPTION

Figure 4:
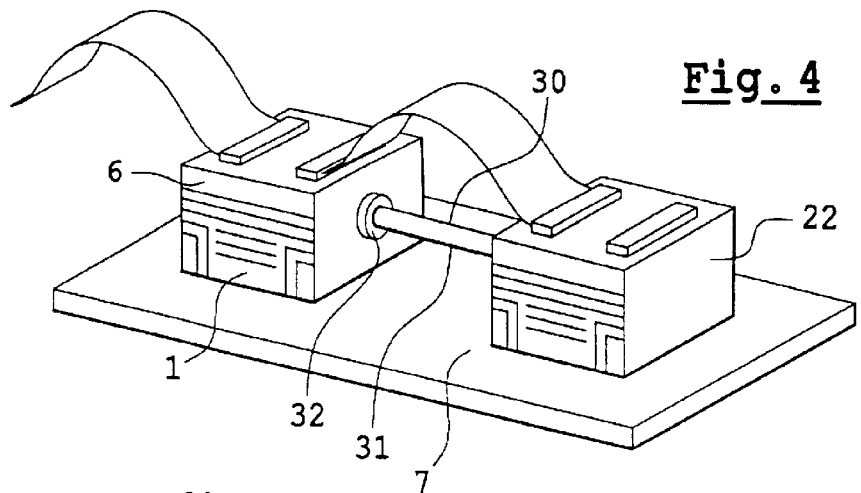
FIG. 4 is a view of two electronic modules provided with heat removal means of the invention and interconnected in a fourth manner.

FIG. 1 shows an electronic module 1. The electronic module 1 is preferably an integrated electronic module, of small size. The electronic module 1 is of three-dimensional structure, and has a plurality of faces. It offers inlet and/or outlet ports on a plurality of its faces.

By way of example, the electronic module 1 includes a specialized integrated circuit 2. In a preferred embodiment, the module 1 includes a plurality of specialized integrated circuits such as 2, known as ASICs, placed inside a volume formed by the electronic module 1. The module 1 is preferably in the form of a rectangular parallelepiped, and more particularly in the form of a cube. Thus, the ASICs such as 2 contained in the module 1 can be juxtaposed and/or stacked. This structure for the module 1 makes it possible to reduce the overall weight of the module. The ASIC 2 is disposed, for example, in a central zone of the cube formed by the module 1.

An ASIC 2 perform numerous functions. Thus the power dissipated by such a circuit 2 is large, and as a result the module 1 gives off a large quantity of heat. For example, an electronic module such as 1 can have five ASICs such as 2, together with 250 connection ports, in which case the module 1 can dissipate power of about 10 watts (W). In a variant, an integrated module such as 1 can have 600 connection ports, in which case it can dissipate power of as much as 30 W.

To this end, the module 1 has means for removing heat from the circuit 2 to the outside. This heat removal means is a heat drain 3. Particularly in the case when the ASIC 2 is in a central position, the heat drain 3 comprises a first portion 4 and a second portion 5.

The first portion 4 transfers heat from the ASIC 2 to an outside face 6 of the module. The first portion 4 transfers heat by conduction.

The second proton 5 transfers heat from said outside face 6 to a soleplate 7 to which the module 1 is connected. The soleplate 7 acts as a heat sink. It is selected to present good heat exchange capacity. The soleplate 7 is dedicated to removing heat and it does not provide electronic connections with the module 1, this enables it to remove a large quantity of heat. The soleplate 7 makes it possible to increase the number of connections between the module and other components.

Given that a preferred use of such a module 1 lies in the aerospace industry, mere convection on the outside surface 6 does not suffice to provide sufficient cooling. The second portion 5 thus removes heat by conduction. The outside face 6 in the example shown in FIG. 1 is separate from a face of the module 1 that makes contact with the soleplate 7.

The ASIC 2 is generally encapsulated in a resin or a plastics material. This encapsulation resin is preferably glass-filled epoxy resin. In addition, a main structural matrix of the module 1 is also made of resin or of plastics materials, and preferably glass-filled epoxy resin.

The first portion 4 has a chip 8 mounted on a side edge 9 of the circuit 2. This chip 8 can be bonded to the edge 9 by adhesive or by solder, for example. The chip 8 is made of a material having a thermal expansion coefficient that is substantially identical to that of the resin encapsulating the circuit 2. For example, the chip 8 is made of an aluminum and/or silicon composite material. This guarantees that heat is transferred uniformly between the circuit 2 and the chip 8. Furthermore, whatever the temperatures to which these elements are raised, since the coefficients of expansion of the chip 8 and of the circuit 2 are substantially identical, the structure of the module 1 remains stable.

The first portion 4 also has a channel 10 connecting the chip 8 to a zone 11 of the outside face 6. The channel 10 is conductive. It is preferably made of a composite material having a metal matrix. The material is specially designed to enable heat to be conducted from the circuit 2 to the zone 11 while ensuing that the heat conveyed by the conductive channel 10 does not melt the main matrix from which the module 1 is constructed. Like the chip 8, the conductive channel 10 is made of a material whose heat exchange coefficient is similar to that of its environment in the module 1.

Given that the module 1 and the first portion 4 are made of similar materials, they have poor capacity to remove heat. The second portion 5 provides a system having higher performance than the first portion 4 in terms of removing the heat produced by the module 1. For this purpose, the second portion 5 includes a heat pipe 12. The heat pipe 12 has a first end 13 and a second end 14. The first end 13 is connected to the zone 11 of the outside face 6. The second end 14 is mounted on the soleplate 7.

The heat pipe 12 is preferably made of a material that provides good heat conduction. The heat pipe 12 has a first segment 15 mounted along the outside face 6, and a second segment 16 mounted on a top face 17 of the soleplate 7. The first segment 15 is, for example, stuck to the outside face 16 using a special adhesive. This special adhesive ensures that the outside face 6 of the module 1 does not melt when the heat pipe 12 is conveying heat along said face 6. Thus, heat conduction in the heat pipe 12 does not damage the outside surface 6. The segment 15 enables the heat pipe 12 to be brought to the top face 17 of the soleplate 7. The module 1 has a face 18 such that the face 18 is preferably placed on said surface 17. In the example shown in FIG. 1, the face 18 is orthogonal to the face 6.

The heat pipe 12 is a closed tube containing a fluid in an internal cavity. The fluid of the heat pipe 12 can be set into motion inside the tube by means of a temperature gradient. Fluid circulation inside the internal cavity between the ends 13 and 14 serves to transfer heat. In a preferred embodiment of the invention, the heat pipe 12 is a cylindrical tube whose inside wall is fluted. Fluid circulation inside the heat pipe 12 is made possible by the fact that a temperature gradient exists between its ends 13 and 14. At the end 13, in contact with the zone 11, the fluid contained inside the heat pipe 12 is for the most part in the vapor phase. Then on coming closer to the end 14, the fluid is mainly in liquid form. There is a vapor gradient inside the heat pipe 12. Thus, the fluid is vaporized at the end 13 and then condensed along the walls of the tube so as to return in liquid form to the end 14. The fluting of the tube serves to increase the contact area and thus the evaporation/condensation phenomena of the fluid. Circular movement is thus established between the ends 13 and 14. This enables a temperature difference of several degrees to be maintained between the two ends.

For example, the heat pipe 12 can have a total length of 20 centimeters (cm). The heat pipe 12 can be a microcapillary tube, for example, e.g. having a diameter of 2 millimeters (mm). The fluid contained in such a heat pipe 12 is selected as a function of its evaporation temperature and as a function of the range of temperatures over which such a module 1 is to be used. The heat pipe 12 contains water and/or alcohol for preferred use of this module in the aerospace industry.

In a variant, the module 1 is provided with a plurality of second portions such as 5. As shown in FIG. 1, it can include, for example, a second heat pipe such as 12. Together the heat pipes 12 conduct the heat. Furthermore, having a multiplicity of heat pipes 12 makes it possible to propose heat pipes containing either water or alcohol. Since the evaporation and condensation temperatures of these two fluids are distinct, this makes it possible in the aerospace industry to use alcohol heat pipes which are liquid from −55° C. to remove the heat produced by circuits such as 2 at low temperature, whereas water heat pipes become functional only at temperatures greater than 0° C. However since water heat pipes are more efficient than alcohol heat pipes, the module 1 is provided with a minority of alcohol heat pipes for removing heat when the module 1 starts being used, and a majority of water heat pipes for providing massive conduction of the heat given off by the module in normal operation.

The heat drain 3 is thus efficient at removing the heat produced by the electronic module 1 into the soleplate 7.

In order to be operational, the electronic module 1 needs at least one electronic interconnection means. The soleplate 7 is independent of this interconnection means.

In FIG. 1, the interconnection means is a connector 19 mounted on a face 20 such that the face 20 is different from the face 18. In a first embodiment, the connector 19 is connected to a flexible printed circuit 21 to connect the module 1 to a second connector 23 on a second electronic module 22.

The second module 22 can be made in identical manner to the first electronic module 1, in which case it is likewise mounted on the top surface 17 of the soleplate 7. Under such circumstances, the second electronic module 22 also has an electronic assembly with heat removal such as 3.

In a variant, the second module 22 can be mounted on a substrate that is equivalent to that of the soleplate 7, for example so that the top faces of the modules 1 and 22 lie in a common plane.

In a second embodiment, as shown in FIG. 3a, the interconnection means is a contact matrix 24 comprising spring contacts 25, the contact matrix 24 being placed between a face such as the face 20 of the module 1 and a printed circuit card 26. The printed circuit card 26 can also be connected to the second module 22 as shown in FIG. 3a, for example.

In a third embodiment, as shown in FIG. 3b, the interconnection means is a matrix of contacts having spring contacts as shown in FIG. 3a, but also including second connection means. The second connection means comprise, for example, a printed circuit card 26' mounted on the module 22, and an intermediate flexible printed circuit 29 for connecting the printed circuit card 26 to the second printed circuit card 26'.

These printed circuit cards 26 and 26' can also have other connectors 27 for making connections with other elements. The card 26 is held to the module 1 in part by mounting the card 26 on a stiffener 28. For example, the card 26 can be screwed to the stiffener 28.

In the fourth embodiment as shown in FIG. 4, the interconnection means can be optical interconnection 30. In this fourth embodiment, the optical interconnection 30 comprises an optical fiber 31 and a first optical connector 32. The first optical connector 32 is mounted on the module 1. The optical fiber 31 can also be connected to the module 22 via a second optical connector (not shown). To guarantee high precision in bringing an optical fiber end into register with an optical connector, the fiber 31 has a connector that is complementary to the optical connector 32. This complementary connector includes means for aligning the fiber with the optical connector.

Figure 5A:
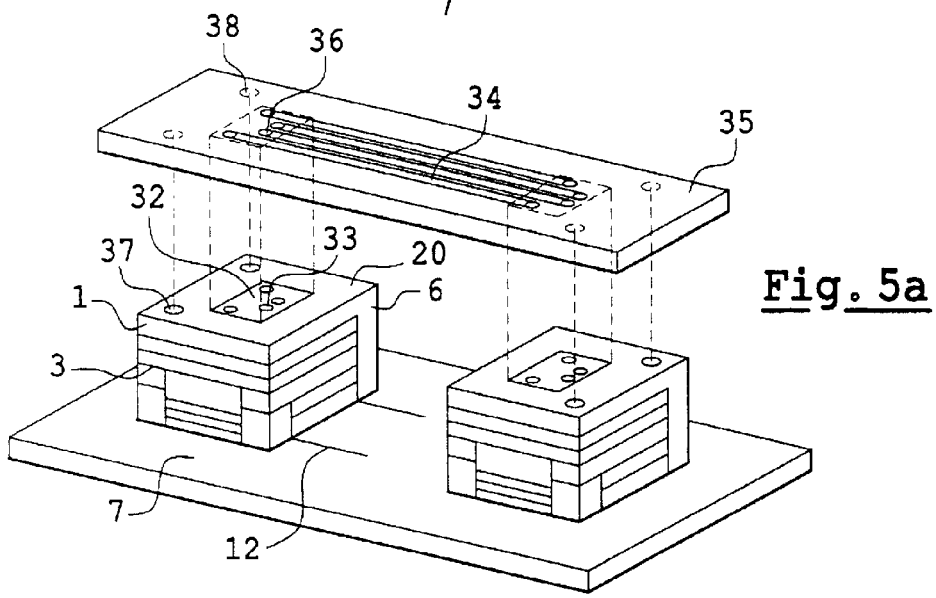
FIG. 5a is a view of an electronic module connected with a printed circuit card in a fifth embodiment of the invention.

In a fifth embodiment, as shown in FIG. 5a, the optical interconnection means includes at least a first optical connector 32 on the module 1 and a second optical connector on a printed circuit 35. For example, the optical connector 32 is a matrix 32 of optical contacts 33. These optical contacts 33 can be diodes, in which case the matrix 32 is a matrix of vertical cavity surface emission lasers (VCSELs), or of photodiodes, respectively for sending or receiving light signals.

By way of example, the second optical connector is one end 36 of an optical fiber 34 included in the printed circuit 35. The end 36 of the optical fiber 34 is put into register with an optical contact 33 of the matrix 32. The end 36 of the fiber 34 is curved through 900, for example, so that a section of said fiber 34 perpendicular to a transmission axis for the light signal is parallel to a plane formed by the printed circuit 35, and in particular is parallel to a light-reception or light-emission surface of an optical contact 33.

The optical connector 32 is preferably placed on a face of the module 1 that does not include heat drains such as 3.

The precision with which the end 36 of the optical fiber 34 and the optical contact 33 are assembled and put into register is guaranteed by a ball-grid array (BGA) type assembly. Metal balls 37 are bonded to the face of the module 1 that has the optical connector 32. These balls 37 are preferably made of tin lead. The balls 37 are bonded by an automatic machine which places the balls 37 at very precise locations on the module 1 and which also guarantees that each of the balls 37 is rounded in shape.

Furthermore, the printed circuit card 35 has reception areas 38 for the balls 37. A reception area 38 preferably comprises a round metal area of the printed circuit 35. These metal areas 38 are made of a material whose melting temperature is lower than that of the balls 37. These reception areas 38 are also distributed in very precise manner over the printed circuit 35 by means of an automatic machine.

When the module 1 is mounted on the printed circuit card 35, the module 1 is placed approximately in registered with the printed circuit and the assembly is put into an oven. In the oven, the balls are raised to high temperature and become partially liquid. Then by capillarity, as the balls 37 melt, the balls 37 on the module 1 are brought into exact alignment with the reception areas 38 of the printed circuit 35. The printed circuit 35 is at a very short distance from the balls 37 such that the positioning of the electronic module 1 on the printed circuit card 35 takes place automatically by said module 1 being moved slightly relative to the card 35 so that the balls 37 are accurately placed in register with the metal areas 38 of the printed circuit 35 with which they fuse. The small displacement is obtained in particular by capillary forces.

The module 1 is then mounted very precisely relative to the printed circuit 35. In that the connection between the balls 37 and the reception areas 38 of the printed circuit 35 is precise, so the same precision of alignment is obtained between the optical contacts 33 and the ends 36 of the optical fibers 34.

These physical connections, obtained by the balls 37 and the reception areas 38 fusing, makes it possible in particular to establish static inputs and outputs, in particular for conveying signals, and preferably signals that are not sensitive to electromagnetic fields. For example, the balls 37 can be connected to an ASIC such as 2 in the module 1 and the reception areas 38 can be connected to respective conductor tracks of the printed circuit 35. These static inputs and outputs provide interconnection options additional to those already provided by the first interconnection means which are optical, which optical interconnection means provide dynamic inputs and outputs.

Such a connection system makes it possible to obtain a gap between the optical contacts 32 and the end 36 of the fiber 34 of about 250 micrometers ($\mu$m). This makes it unnecessary to use converging lenses to cause light signals conveyed between the contacts 33 and the end 36 to converge. Furthermore, given the ease with which the ends of the optical fibers included in a printed circuit are put into register with the optical contacts, it is possible to increase the density of the optical contacts presented by the module 1.

Furthermore, in order to guarantee precise and permanent alignment of the optical contacts 33 with the ends 36 of the optical fibers 34 included in the printed circuit 35, a printed circuit 35 and a module 1 are selected that have the same coefficient of expansion. Thus regardless of any changes in temperature applied to these various elements, the optical interconnections remain in alignment.

In a variant, provision can be made for the second module 22 to be connected in the same manner as the module 1 with the printed circuit card 35, such that one end of the optical fiber 34 included in the printed circuit 35 is in register with optical contacts such as 33 in the module 22. This provides optical interconnection between the modules 1 and 22 without requiring complementary connectors to be present for said optical contacts on the printed circuit 35.

Figure 5B:
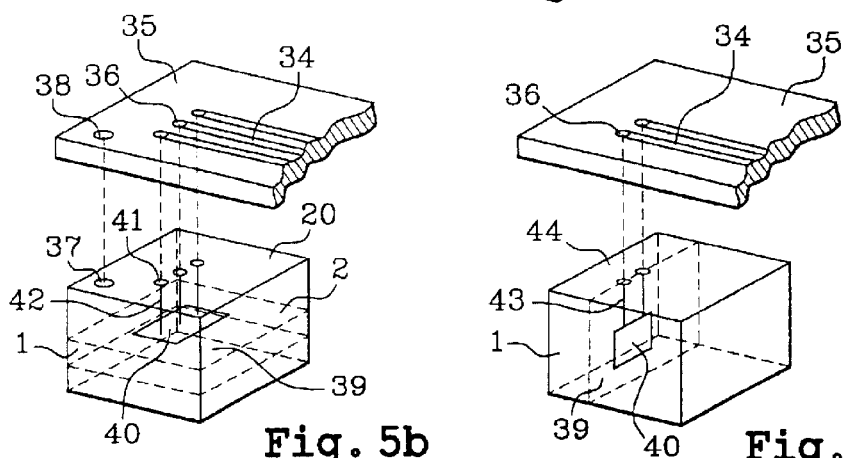
FIG. 5b is a view of an electronic module connected with a printed circuit card in a sixth embodiment of the invention.

In a sixth embodiment as shown in FIG. 5b, the module 1 has a plurality of ASICs such as 2, and for example these ASICs are placed parallel to one another and parallel to a printed circuit card such as 35, the printed circuit card being for mounting on a face such as 20 of the module 1 in the same manner as in the fifth embodiment. Thus, in this sixth embodiment, the printed circuit card such as 35 is mounted on the module 1 by using a BGA type mounting. An ASIC 39 placed inside the module 1 has an electronic component 40 provided with an optoelectronic interface. This electronic component 40 is not present at the level of the surface 20. It is situated inside the module 1. Thus in order to connect the optoelectronic interface of the component 40, ends such as 36 of fibers such as 34 of the printed circuit such as 35 are put into register with sections 41 of optical fibers 42. The optical fibers 42 are connected to the optoelectronic interface of the component 40.

Figure 5C:
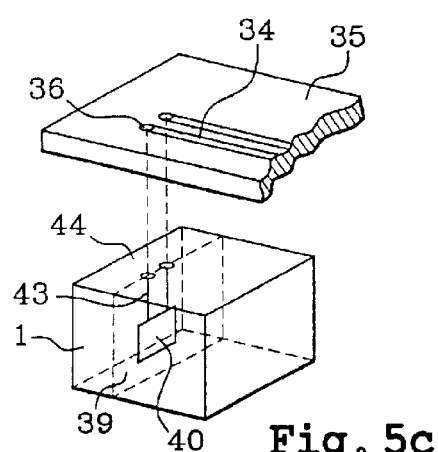
FIG. 5c is a view of an electronic module connected with a printed circuit card in a seventh embodiment of the invention

A seventh embodiment, as shown in FIG. 5c, is a variant of the sixth embodiment. In this seventh embodiment, the ASIC such as 39 is disposed perpendicularly to a face such as 20, the face such as 20 being for assembly with a printed circuit card such as 35 using BGA type mounting. In this embodiment, the component such as 40 of the circuit such as 39 is for connection with ends such as 36 of fibers such as 34 of the circuit such as 35 by means of optical fibers 43. The assembly fibers 43 are connected to the components 40 and are embedded in the resin of the ASIC. Each of the optical fibers 43 presents a section 44 that is flush with the surface such as 20. The sections 44 are mounted in register with the ends such as 36.

In a variant of this seventh embodiment, the fibers 43 are replaced by optical waveguides integrated in the resin of the ASIC 39.

In a preferred embodiment, the ends 36, 41, and 44 of the optical fibers 34, 42, and 43 respectively of the fifth, sixth, and seventh embodiments, have respective lenses etched thereon to improve the quality of signal light transmission. Such etched lenses can be refractive or diffractive.

What is claimed is:

1. An electronic assembly comprising at least a first integrated electronic module, the first module including at least one interconnection means for optical connection to a printed circuit card or to a second electronic module, the assembly including a soleplate and heat removal means for removing heat from said module via a first face of said module to the soleplate, and wherein the heat removal means includes a pipe having a first end and a second end and containing a fluid; wherein the first end is connected to the first face and the second end is connected to the soleplate, wherein the soleplate is independent of the interconnection means of the first module; and wherein the first face of said module is distinct from a second face of said module that contacts said soleplate.

2. An assembly according to claim 1, wherein the interconnection means includes an optical fiber.

3. An assembly according to claim 2, wherein the optical fiber is included in a printed circuit card, and wherein a first end of the fiber is mounted in register with an optical contact of the first module by means of balls bonded to the module and disposed with precision relative to metal areas of the printed circuit card.

4. The assembly according to claim 3, wherein the first end of the optical fiber includes an etched lens.

5. An assembly according to claim 1, wherein the interconnection means includes a printed circuit card portion connected to the first module and a second printed circuit card portion connected to the second module, the two cards being interconnected by a second interconnection means.

6. An assembly according to claim 5, wherein the two cards are secured to each other and the second interconnection means is constituted by tracks interconnecting the two card portions.

7. An assembly according to claim 5, wherein the interconnection means includes a flexible printed circuit.

8. An assembly according to claim 1, wherein the interconnection means comprise a contact matrix, the contact matrix being mounted between the module and the printed circuit card.

9. An electronic assembly comprising at least a first integrated electronic module, the first module comprising at least one interconnection means for optical connection to a printed circuit card or to a second electronic module, the assembly further comprising a soleplate and a heat removal system that removes heat from said first module to the soleplate, and wherein the soleplate is independent of the interconnection means of the first module; wherein the heat removal system comprises a first segment and a second segment, the first segment connecting an integrated circuit of the first module to a first face of the first module, the first face being distinct from a second face making contact between the first module and the soleplate, and the second segment connecting said second face to the soleplate.

10. An assembly according to claim 9, wherein the interconnection means includes a flexible printed circuit.

11. An assembly according to claim 9, wherein the first segment comprises a heat conductive channel.

12. An assembly according to claim 9, wherein the second segment comprises a closed heat pipe containing a fluid.

13. An assembly according to claim 12, wherein the heat pipe is a long cylindrical tube having a fluted inside wall.

14. The assembly according to claim 12, wherein the fluid is one of water, alcohol, and a combination of water and alcohol.

15. The assembly according to claim 9, wherein the interconnection means includes an optical fiber.

16. The assembly according to claim 15, wherein the optical fiber is included in a printed circuit card, and wherein a first end of the fiber is mounted in register with an optical contact of the first module by means of balls bonded to the module and disposed with precision relative to metal areas of the printed circuit card.

17. The assembly according to claim 9, wherein the interconnection means includes a flexible printed circuit.

18. The assembly according to claim 9, wherein the interconnection means includes a printed circuit card portion connected to the first module and a second printed circuit card portion connected to the second module, the two cards being interconnected by a second interconnection means.

19. The assembly according to claim 18, wherein the two cards are secured to each other and the second interconnection means is constituted by tracks interconnecting the two card portions.

20. The assembly according to claim 18, wherein the second interconnection means is a flexible printed circuit.

21. The assembly according to claim 9, wherein the interconnection means comprise a contact matrix, the contact matrix being mounted between the module and the printed circuit card.

22. An electronic assembly comprising at least a first integrated electronic module, the first module comprising at least one interconnection that connects to a printed circuit card or to a second electronic module, the assembly further comprising a soleplate and a heat removal system that removes heat from said first module to the soleplate, and wherein the soleplate is independent of the interconnection of the first module;

wherein the heat removal system comprises a first segment and a second segment, the first segment connecting an integrated circuit of the first module to a first face of the first module, the first face being distinct from a second face making contact between the first module and the soleplate, and the second segment connecting said second face to the soleplate.

* * * * *